United States Patent [19]

Bianchin et al.

[11] 4,421,677
[45] Dec. 20, 1983

[54] TRANSPARENT MATERIAL HAVING ELECTRICAL CONDUCTIVITY WHICH IS DEPENDENT ON THE DOSE OF OPTICAL RADIATION RECEIVED

[75] Inventors: Christian Bianchin, Saint Martin d'Heres; Alain F. Deneuville, Vif; Philippe Gerard, Meylan, all of France

[73] Assignees: Commissariat a l'Energie Atomique, Paris; Agence Nationale de Valorisation de la Recherche (ANVAR), Neuilly-sur-Seine, both of France

[21] Appl. No.: 919,976

[22] Filed: Jun. 28, 1978

[30] Foreign Application Priority Data

Jun. 29, 1977 [FR] France ............................ 77 19922

[51] Int. Cl.³ .......................................... H01C 13/00
[52] U.S. Cl. .................................. 252/501.1; 252/515; 252/518
[58] Field of Search ..................... 252/501.1, 512, 515, 252/518, 600; 428/432, 433, 457; 350/356, 357

[56] References Cited

U.S. PATENT DOCUMENTS

| | | | |
|---|---|---|---|
| 4,203,769 | 5/1980 | Guestaux | 252/518 |
| 4,211,475 | 7/1980 | Malugani et al. | 252/518 |
| 4,225,216 | 9/1980 | Boyd et al. | 252/518 |
| 4,340,506 | 7/1982 | Toda et al. | 252/501.1 |

Primary Examiner—Josephine Barr

[57] ABSTRACT

The transparent material is constituted by a thin film of a substoichiometric amorphous oxide of molybdenum or tungsten, the electrical conductivity of the material being dependent on the dose of optical radiation which it has received. The potential applications of the material include the fabrication of memory devices and image converter devices.

1 Claim, 7 Drawing Figures

TRANSPARENT MATERIAL HAVING ELECTRICAL CONDUCTIVITY WHICH IS DEPENDENT ON THE DOSE OF OPTICAL RADIATION RECEIVED

This invention relates to a transparent material whose electrical conductivity is dependent on the dose of optical radiation which it has received, to devices for the application of said material and to a method of fabrication of this latter. The invention finds an application in optoelectronics and especially in the construction of memories and image converters.

It is known that certain metallic oxides are well suited to the construction of electrooptical systems based on phenomena of photochromism or electrochromism. Relevant information on this subject can be obtained from the article by S. K. Deb entitled "A Novel Electrophotographic System" and published in "Applied Optics", suppl. No 3, 1969, pages 192-195 and in U.S. Pat. No. 3,829,196 granted on Aug. 13, 1974 in respect of "Variable Light Transmission Device". These documents describe electrochromic and photochromic materials and in particular metal oxides belonging to Column VI of the periodic table of elements.

It can be recalled electrochromism and photochromism designate the properties whereby certain substances are capable of assuming a color or changing color when they are subjected either to an electric field or to an electromagnetic radiation. This phenomenon results from the appearance or the displacement of an absorption band in a portion of the optical spectrum, usually in the red region. When the excitation (electrical or optical) disappears, the material remains in its excited state but is capable of recovering its transparency or its initial color after a suitable treatment.

In the documents cited earlier, it is noted that photochromic and/or electrochromic materials have an electrical conductivity which depends on the voltage applied thereto or on the degree of illumination which they receive. It is taught especially in the article published in "Applied Optics" that the tungsten oxide $WO_3$ has a conductivity which increases with the time of exposure to ultraviolet radiation. This variation in electrical conductivity of the oxide, however, is always associated with the variation in color of the material, these two variations being concomitant.

Researches undertaken by the present Applicants have in fact shown that, in certain cases, metal oxides of Group VI have the property of possessing electrical conductivity which depends on the degree of illumination whereas the phenomenon of photochromism is absent since the material is and remains transparent. This result is surprising since it is in contradiction with the wide-spread belief that conductivity and photochromism go together.

This novel and unexpected property of certain oxides is related to a particular substoichiometry. In the case of tungsten, for example, the phenomenon takes place when the oxide corresponds to the formula $WO_x$ with $2.2 < x < 2.6$, where x is preferably in the vicinity of 2.4.

The increase in electrical conductivity which is observed after an optical excitation persists after cessation of the excitation. The phenomenon therefore involved is one of "pseudophotoconductivity" if it is considered that photoconductivity in the strict sense of the term is a reversible phenomenon which terminates as soon as the excitation disappears. This phenomenon can also be designated as "residual photoconductivity". The material in accordance with the invention is therefore sensitive to the "dose" of radiation received, namely to the quantity of radiation integrated during the period of exposure.

In order to erase the increase in conductivity, it is only necessary to heat the material above a predetermined temperature.

In more exact terms, the present invention is therefore directed to a transparent material whose electrical conductivity is dependent on the dose of optical radiation which it has received, said material being essentially constituted by a thin layer of substoichiometric amorphous oxide of tungsten or molybdenum.

The metal can be chromium molybdenum or tungsten.

The thickness of the oxide layer is preferably within the range of 5000 Å and a few microns.

By way of application, the invention is also directed to a memory device and to an image converter device.

The memory device essentially comprises:
a layer of material as defined in the foregoing,
optical writing means for directing a beam of optical radiation onto a zone of said material,
electrical reading means for measuring the conductivity of said zone,
thermal erasing means constituted by means for raising the temperature of the layer of material above a predetermined value.

The image converter device essentially comprises a layer of the material as defined above and inserted in an electric circuit through which a current passes, the intensity of said current being dependent on the dose of light radiation received by the layer.

In the majority of cases, the radiation which serves to illuminate the material is an ultraviolet radiation, the wavelength of which is shorter than 0.3 $\mu$m, for example.

The distinctive features and advantages of the invention will in any case become more readily apparent from the following description of exemplified embodiments which are given by way of indication without any limitation being implied, reference being made to the accompanying drawings, in which:

FIG. 1 illustrates the time-dependent variation of electrical conductivity of the substoichiometric tungsten oxide $WO_{2.4}$ at the time of pulsed irradiation;

FIG. 2 gives the curve which is representative of the variations in difference of conductivity induced by ultraviolet radiation as a function of the substoichiometry of tungsten oxide;

Although the invention is not limited solely to these particular cases, the following description refers to the tungsten oxide $WO_x$, where x is in the vicinity of 2.4 and to the molybdenum oxide $Mo\ O_x$, where x is in the vicinity of 2.55.

Figure 1:
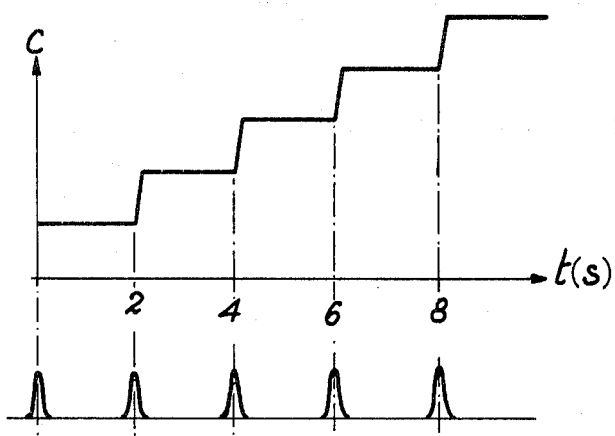

FIG. 1 shows the progressive variation in electrical conductivity C of a thin layer of tungsten oxide having a thickness of approximately 1 μm. Said progressive variation is plotted as ordinates in arbitrary units as a function of time which is plotted as abscissae and expressed in seconds, and takes place when said layer is exposed to a train of ultraviolet light pulses having a wavelength in the vicinity of 0.3 μm; this pulse train is shown at the bottom of the figure. The stair-step shape of the curve clearly reflects the cumulative character of the action produced by the radiation on the conductivity.

Figure 2:
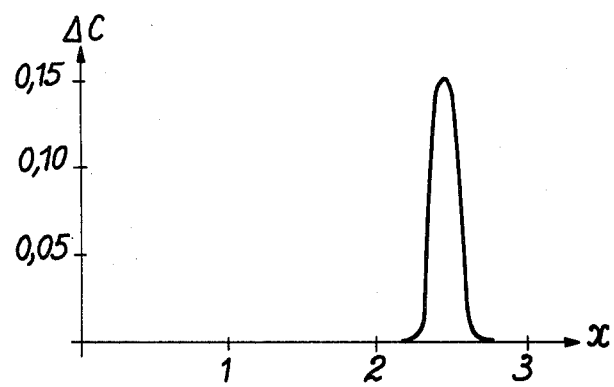

Pseudophotoconductivity without color change is observed only within a relatively narrow range of substoichiometry as illustrated in FIG. 2, in which the variation in conductivity ΔC is plotted as ordinates as a function of the proportion x of oxygen in the tungsten oxide $WO_x$. ΔC corresponds to the difference in conductivity exhibited by a tungsten oxide having a predetermined formula before and after irradiation with a beam of predetermined ultraviolet light. This figure clearly shows the existence of a peak of sensitivity for a value of x in the vicinity of 2.4.

The increase in conductivity under the action of irradiation can be suppressed by heating the material to a temperature above a predetermined value which depends on the composition of the oxide. Researches carried out by the present Applicants have in fact shown that, when the temperature of a substoichiometric amorphous oxide layer is increased, its conductivity begins to rise, then passes through a maximum value and finally decreases to the very low value which already existed prior to irradiation. This phenomenon can therefore be profitably employed for the purpose of "erasing" the effects of irradiation.

Figure 3:
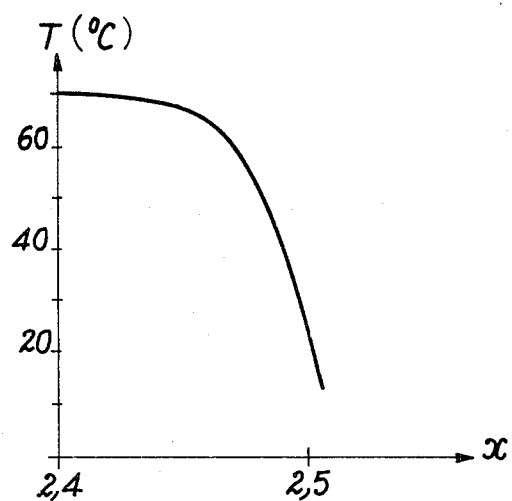
FIG. 3 shows the variations in temperature at which the conductivity passes through a maximum value as a function of the substoichiometry of tungsten oxide.

The value T of the temperature at which the electrical conductivity passes through a maximum depends on the substoichiometry of the oxide layer. This dependence is illustrated in FIG. 3 in the case of the oxide $WO_x$, the temperature T being plotted as ordinates and expressed in degrees C. and the value of x being plotted as abscissae. It is observed in this figure that the maximum values of T are obtained when x is in the vicinity of 2.4, which is precisely the value corresponding to the maximum sensitivity of the layer. A comparison of these two results indicates that the phenomenon of pseudophotoconductivity becomes more stable as a closer relationship to optimum substoichiometry is established.

If the oxide $WO_{2.4}$ is employed, the annealing operation is therefore performed by heating the layer to a temperature above 70° C. It is then necessary to operate in a neutral atmosphere in the presence of an inert gas such as a rare gas, for example. The operation can be performed in air, however, if the oxide chosen is such that the temperature T corresponding to the maximum value of conductivity is of the order of room temperature. It is apparent from FIG. 3 that, when x=2.5, the temperature T is in the vicinity of 20° C. and from FIG. 2 that the sensitivity of the layer remains satisfactory at this value of x.

The applications of the material in accordance with the invention are numerous and many of these latter can be conceived by anyone versed in the optical writing, display, memorization and like techniques which come within the general field of optoelectronics. A memory device and an image converter will now be described by way of explanation.

Figure 4:
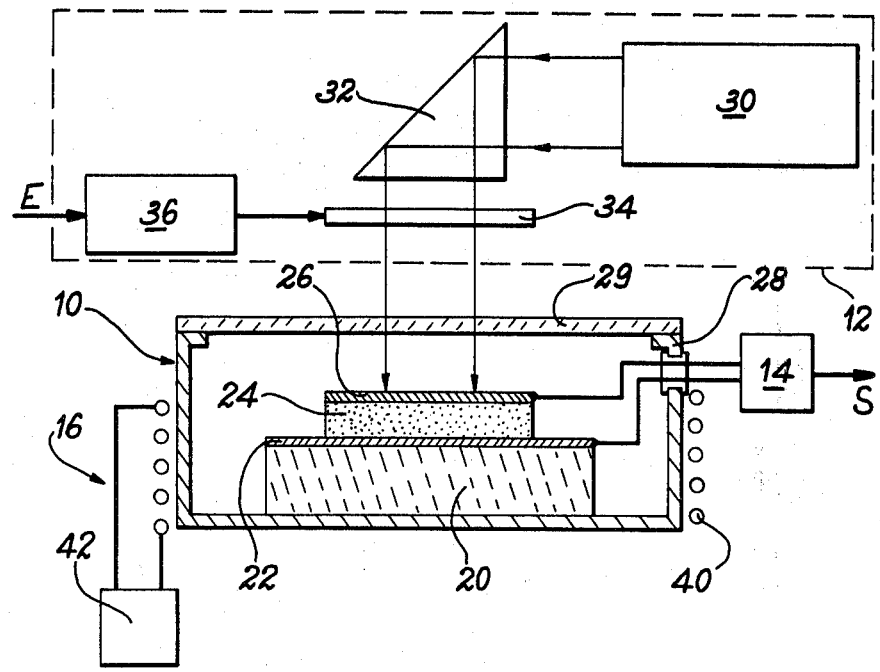
FIG. 4 is a diagrammatic illustration of a memory device which makes use of the material in accordance with the invention.

The memory device of FIG. 4 comprises a storage element 10, optical writing means 12, electrical reading means 14 and thermal erasing means 16.

The storage element is constituted by a plate 20 of insulating material covered with a thin conductive layer 22 and with a substoichiometric oxide layer 24 of a metal of Group VI which is covered with a thin transparent and conductive layer 26. The support plate 20 or substrate can be constituted by a commercially available glass designated by the trade name "Nesa" which has already been covered with a thin conductive layer. The layer 26 can be a gold film or stannic oxide film. The complete assembly can be placed within a leak-tight enclosure 28 which is filled with inert gas and closed by a transparent plate 29.

The writing means 12 comprise a light source 30 (for example a mercury or hydrogen lamp or a laser which emits in the near-ultraviolet region or a laser which emits in the visible region and comprises a frequency doubler) followed by a deflecting system 12 (which can be a prism or an electrooptical system) followed by a shutter 34 controlled by a unit 36; said shutter can be of the Kerr or Pockels cell type or a liquid crystal system.

The reading means 14 are constituted by a circuit for measuring the electrical conductivity of the oxide layer 24.

The erasing means 16 essentially comprise a heating resistor 40 supplied from a voltage source 42. If necessary, said means can be constituted by a high-intensity light source which is capable of heating the oxide layer 24. An infrared source is suitable for this purpose. In some cases, the source 30 can be employed both for writing and erasing if the power and possibly also the wavelength of said source can be modulated. This can be the case especially if the source 30 is a laser which emits in the visible region, associated with a retractable frequency doubler; without a doubler, the power of the laser is sufficient to heat-up the oxide layer but the wavelength is too long to give rise to the phenomenon of pseudophotoconductivity; with a doubler, the power falls to a value which is insufficient to produce heating of the layer but the wavelength becomes sufficiently short to ensure that the conductivity of the layer is modified.

The operation of a memory system of this type follows directly from the explanations given in the foregoing. Storage of a signal in memory is carried out by means of the conductivity of the layer. The signal to be stored is applied for example to the input E of the control unit 36 and initiates opening of the shutter 34 and irradiation of the layer 34 with the light beam which is continuously emitted by the source 30. If reference is made to FIG. 1 described earlier, it will be understood that the conductivity of the layer 24 assumes and retains a value which depends on the total radiation dose which it receives.

If the signal to be stored is constituted by a train of electrical pulses, the oxide layer receives a train of light pulses as in the case of FIG. 1 and the stored information is the sum of the input signals. The memory virtually performs the function of a counter in this case. If the signal E is continuous and possibly variable in some instances, the memory then performs the function of an analog integrator.

At the time of reading, the circuit 14 delivers at its output S a signal whose amplitude is directly proportional to the conductivity of the oxide layer. It should be noted that this reading operation is nondestructive in regard to the stored information.

As can readily be understood, any number of memory cells of the type shown in FIG. 4 can be associated so as to constitute a high-capacity system. In short, FIG. 4 represents only one "memory core" and its peripheral elements. In a memory comprising a plurality of cores, said elements would be common to all the cores; writing and reading operations would be performed sequentially from one core to the next, for example, and the erasing operation would be applied to all the cores.

Figure 5:
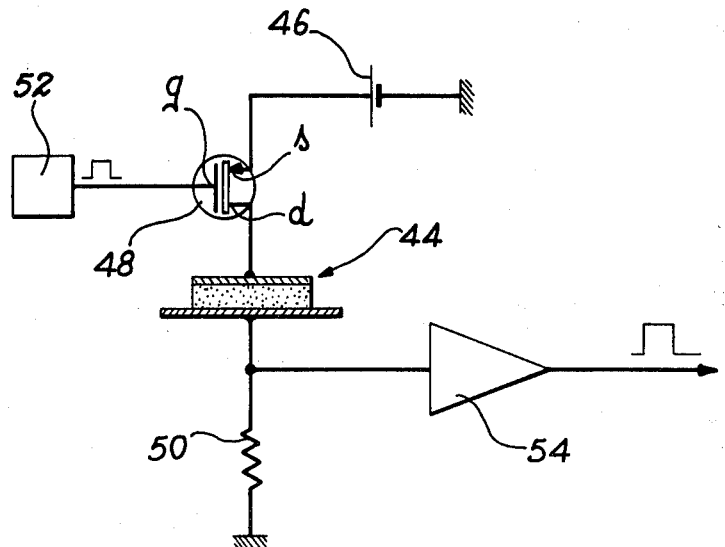
FIG. 5 shows diagrammatically a circuit for measuring the electrical conductivity of a storage element which makes use of the material in accordance with the invention.

By way of explanation, FIG. 5 illustrates a particular mode of construction of the reading means. The storage element 44 is inserted in a line comprising a voltage source 46, a transistor 48 of the field-effect MOS type, for example, and a resistor 50. The transistor 48 has a gate g, a source s, and a drain d. The gate g is connected to a voltage generator 52. An amplifier 54 reads the voltage developed at the terminals of the resistor 50.

The operation of this circuit takes place as follows. The application of a voltage pulse to the gate g of the transistor 48 by means of the circuit 52 triggers said transistor into conduction and a current flows within the arm comprising the channel of said transistor, the element 44 and the resistor 50. The value of this current is dependent on the conductivity of the element 44, with the result that the voltage read by the amplifier 54 is directly a function of said conductivity. When the pulse delivered by the generator 52 falls back to zero, the transistor 48 is caused to cut-off and the voltage collected by the amplifier 54 falls to zero.

Figure 6:
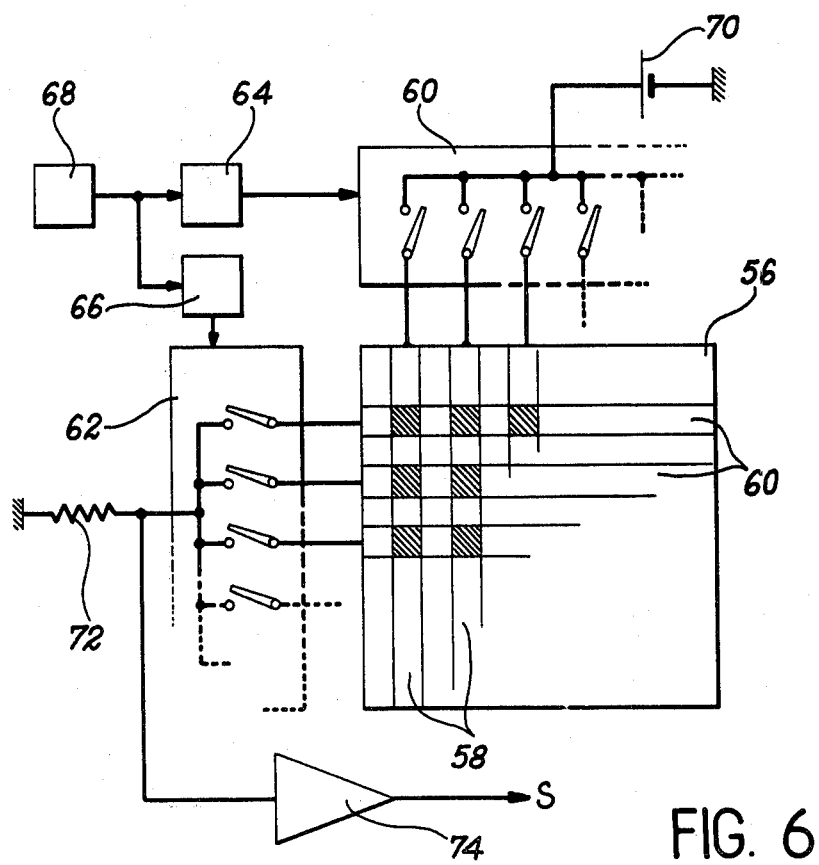
FIG. 6 is a diagrammatic view of a crossed-band image converter device or so-called crossbar device.

FIG. 6 shows diagrammatically an image converter which makes use of the material in accordance with the invention and serves to convert images to electrical signals. This converter comprises a matrix 56 of conversion elements. Each element corresponds to the overlay of two arrays of semitransparent electrodes, one array being formed by the columns 58 and the other array being formed by the lines 60. The material in accordance with the invention is interposed between these two arrays of electrodes. This device is accordingly made up of crossed bands and constitutes a device of the so-called crossbar type. The columns are connected to a column selector 60 and the lines are connected to a line selector 62. Said column selector is controlled by an addressing device 64 and said line selector is controlled by another addressing device 66. These two selectors are controlled by a clock pulse generator 68. Each selector device comprises a plurality of switches constituted by transistors, for example. The band which is connected to each switch can be connected by this latter to a voltage source 70 in the case of a column and to ground through a resistor 72 in the case of a line. An amplifier 74 reads the voltage at the terminals of the resistor 72 and its output constitutes the output S of the converter.

The operation of this device is as follows. An image is projected onto the matrix of elements 56. The electrical conductivity of each element accordingly assumes a value which is a direct function of the radiation dose received. If the exposure time is the same in the case of all the cores, the conductivity at each point or core is dependent on the light intensity of the radiation at this point. After this phase of irradiation, a reading phase is initiated and consists in sequential reading of the conductivity of the different elements exposed. To this end, the selecting-circuit switches 60 and 62 are successively closed by the addressing circuits 64 and 66 at the rate of the pulses emanating from the clock pulse generator 68, with the result that the elements of the matrix are connected between the source 70 and the resistor 72 in a sequential manner, for example line by line. This image scan gives rise to a voltage pulse train transmitted through the connection S. The optical image has therefore been converted to an electrical signal. The pulse train obtained can then be transmitted to a receiving device of the television tube type, for example.

The addressing circuits 64 and 66 as well as the selectors 60 and 62 are not described in detail here since they are well known to anyone versed in the art. They are usually employed in liquid-crystal display devices.

Figure 7:
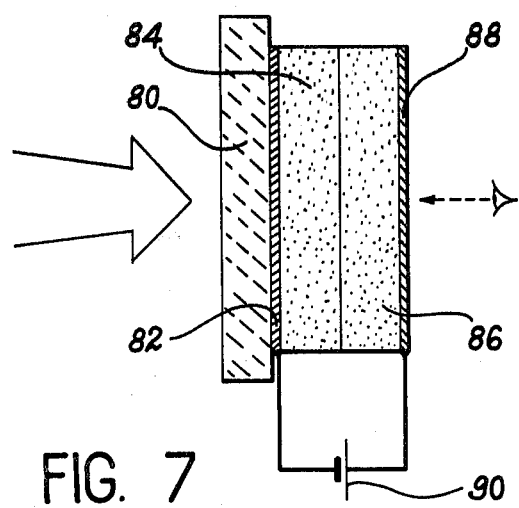
FIG. 7 is a diagrammatic sectional view of a system for the conversion of an ultraviolet image to a visible image.

FIG. 7 shows diagrammatically the structure of another converter system which comprises a transparent substrate 80 covered with a transparent conductive layer 82 (the complete assembly can be constituted for example by a Nesa glass plate, for example), a layer 84 constituted by the material in accordance with the invention, a second layer 86 of an electrochromic or electroluminescent material, a semitransparent electrode 88 and a voltage source 90 connected to the electrodes 82 and 88.

When an image is projected onto the layer 84 through the transparent substrate, the local modifications in conductivity which are induced in this layer gives rise to corresponding modifications in the electric field applied through the layer 86. This layer is in fact either electrochromic or electroluminescent. There therefore appears on the layer 86 an image which corresponds to the projected image point by point. But the observed image can be located in the visible region of the spectrum whereas the projected image is usually in the ultraviolet region. This is therefore a wavelength conversion device.

Furthermore, the brightness of the observed image can be adjusted by producing action on the level of electrical excitation applied to the layer 86. The device is therefore also a brightness amplifier.

It will finally be observed that, since the phenomenon of pseudoconductivity persists after excitation, the image given by a device of this type is residual and this can be an advantage when the projected image is of short duration.

In the device shown in FIG. 7, a material which can constitute the layer 86 is the tungsten oxide $WO_3$, the electrochromic properties of which are known. The advantage of employing this substance in combination with the substoichiometric oxide $WO_{2.4}$ lies in the fact that the method of fabrication of the assembly then becomes very simple since it is only necessary to deposit successively two oxides having different compositions. A particularly straightforward means of ajusting the composition of an oxide layer accordingly consists in deposition by reactive cathodic sputtering.

It is in fact known that thin films of metal oxide can be obtained by a method of this type. Relevant information on this technique can be obtained from the book entitled "Thin Film Phenomena" by K. L. Chopra published by McGraw-Hill Book Company and more especially from Chapter 3 entitled "Cathodic Sputtering", pages 23 to 43.

In order to prepare the material in accordance with the invention. a target constituted by a metal of Group VI or by its oxide is employed, the substrate is cooled to a temperature below approximately 80° C. and a plasma is formed in an oxygen/rare gas mixture. The composition of the plasma remains constant during the deposition operation. The pressure is of the order of $10^{-3}$ to $10^{-2}$ torr. Deviation from stoichiometry is adjusted by modifying the concentration of oxygen.

By way of example, layers of $WO_{2.4}$ have been deposited on a glass substrate in accordance with this method and under the following conditions:
temperature of the glass substrate: 15° C.,
pressure of the mixture Ar-$O_2$: $3 \times 10^{-3}$ torr,
mixture containing 9% oxygen,
tungsten target,
duration of the deposition operation: 3 hours
thickness of the layer: 1 μm.

The properties of a layer of this type are accordingly as follows:
conductivity before illumination: $10^{-14} \Omega^{-1}$,
conductivity after illumination: $10^{-10} \Omega^{-1}$,
radiation employed: energy higher than 3 eV.

Now in regard to the molybdenum oxide Mo Ox, the amplitudes of the stair-steps of FIG. 1 are divided by a factor of the order of 10 and the same applies to the DC of FIG. 2. The active zone of FIG. 2 is slightly displaced towards stoichiometry ($2.4 < x < 2.7$) with a maximum at $x = 2.55$. If 2.4 is replaced by 2.55 and if 2.5 is replaced by 2.65, the annealing temperatures of FIG. 3 remain suitable.

In accordance with this method and by way of example, layers of Mo $O_{2.55}$ have been deposited on a glass substrate under the following conditions:
temperature of the glass substrate: 15° C.,
pressure of the mixture Ar-$O_2$: $3 \times 10^{-3}$ torr,
mixture containing 17% oxygen,
duration of the operation: $4\frac{1}{2}$ hours,
thickness of the layer: 0.8 μm.

The properties of a layer of this type are accordingly as follows:
conductivity before illumination: $10^{-12} \Omega^{-1}$,
conductivity after illumination: $10^{-9} \Omega^{-1}$,
radiation employed: energy higher than 3 eV.

What we claim is:

1. A transparent material whose electrical conductivity is dependent on the dose of optical radiation which it has received, said material comprising a thin layer of substoichiometric amorphous oxide of a metal selected from the group consisting of $WO_x$ and $MoO_x$, wherein $WO_x$ is in the range of $2.2 < x < 2.6$ and $MoO_x$ is in the range of $2.4 < x < 2.7$.

* * * * *